United States Patent
Wong et al.

(10) Patent No.: US 10,593,869 B2
(45) Date of Patent: Mar. 17, 2020

(54) METHODS FOR PATTERNING A MAGNETIC SENSING LAYER

(71) Applicant: Allegro MicroSystems, LLC, Manchester, NH (US)

(72) Inventors: Harianto Wong, Southborough, MA (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/219,694

(22) Filed: Jul. 26, 2016

(65) Prior Publication Data
US 2018/0033955 A1    Feb. 1, 2018

(51) Int. Cl.
| H01L 43/08 | (2006.01) |
| H01L 43/12 | (2006.01) |
| H01L 43/10 | (2006.01) |
| H01L 43/02 | (2006.01) |
| G01R 33/09 | (2006.01) |

(52) U.S. Cl.
CPC .............. *H01L 43/08* (2013.01); *G01R 33/09* (2013.01); *H01L 43/02* (2013.01); *H01L 43/10* (2013.01); *H01L 43/12* (2013.01)

(58) Field of Classification Search
CPC ......... H01L 43/02; H01L 43/08; H01L 43/10; H01L 43/12; G01R 33/09
See application file for complete search history.

(56) References Cited

U.S. PATENT DOCUMENTS

| 6,458,603 B1 * | 10/2002 | Kersch | H01L 43/12 257/E27.005 |
| 7,001,783 B2 | 2/2006 | Costrini et al. | |
| 8,747,680 B1 | 6/2014 | Deshpande et al. | |
| 2004/0012056 A1 * | 1/2004 | Nejad | G11C 11/15 257/414 |
| 2011/0008915 A1 * | 1/2011 | Nozieres | G11C 11/16 438/3 |
| 2011/0062537 A1 | 3/2011 | Oh et al. | |

(Continued)

OTHER PUBLICATIONS

U.S. Appl. No. 15/195,124, filed Jun. 28, 2016, Anderson, et al.

(Continued)

*Primary Examiner* — Tucker J Wright
*Assistant Examiner* — Scott Stowe
(74) *Attorney, Agent, or Firm* — Daly, Crowley, Mofford & Durkee LLP

(57) ABSTRACT

The present disclosure is directed towards a method for patterning a magnetic sensing layer. The method includes disposing a protective layer on a first of a substrate, disposing a first insulating layer on a first surface of protective layer. An opening is formed in the first insulating layer to expose the first surface of the protective layer. A magnetic sensing layer is disposed over the first insulating layer and a predetermined portion of the first surface of the protective layer within the opening. A second insulating layer can be disposed over the magnetic sensing layer. The second insulation layer and the magnetic sensing layer can be removed from the first insulation layer. Thus, the opening includes the magnetic sensing layer and the second insulation layer after the removal of the second insulation layer and magnetic sensing layer from the first insulation layer.

32 Claims, 6 Drawing Sheets

(56) References Cited

U.S. PATENT DOCUMENTS

2013/0032908 A1  2/2013  Tang et al.
2013/0099336 A1* 4/2013  Min-Hwa ............... H01L 43/08
                                              257/421
2014/0332914 A1  11/2014 Liou et al.

OTHER PUBLICATIONS

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.microchem.com/Prod-PMGI_LOR.htm; Feb. 14, 2012; 2 Page.

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

U.S. Non-Final Office Action dated Jul. 14, 2017 for U.S. Appl. No. 15/195,124; 10 Pages.

\* cited by examiner

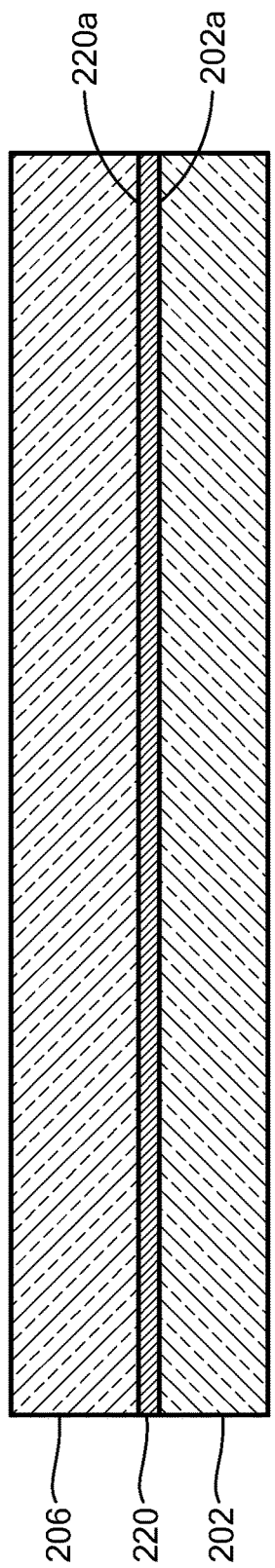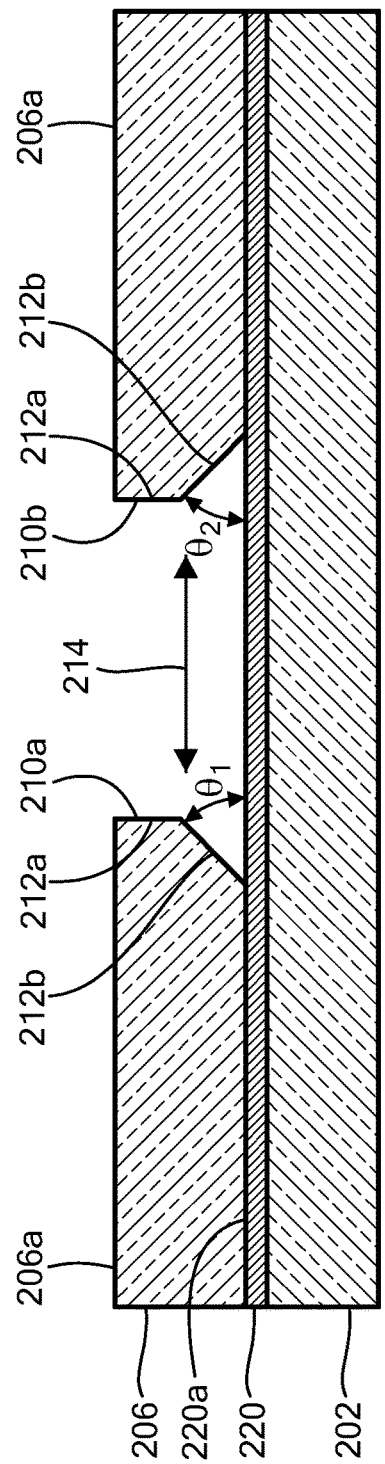

METHODS FOR PATTERNING A MAGNETIC SENSING LAYER

FIELD OF THE INVENTION

The concepts, systems, circuits and techniques described herein relate generally to semiconductor processing and more particularly, to techniques for patterning a magnetic sensing layer and related structures.

BACKGROUND

As is known in the art, ion beam etching (IBE) is used in many semiconductor manufacturing processes. Ion beam etching can be used to remove resist layers formed on a semiconductor material. For example, a resist layer can be deposited on a substrate made of a semiconductor material. A mask layer can be used to selectively expose portions of the resist layer and form a pattern. The semiconductor material can then be exposed to an ion beam. The impact of the ions erodes areas not covered by the mask layer to provide a desired semiconductor structure.

SUMMARY

The concepts, systems, circuits and techniques described herein are directed toward techniques for patterning a magnetic sensing layer and resulting structures formed from such techniques.

In accordance with one aspect of the concepts, systems, circuits and techniques described herein, a method for patterning a magnetic sensing layer includes disposing a protective layer on a first of a substrate, the substrate having first and second opposing surfaces. The method further includes disposing a first insulating layer on a first surface of the protective layer, forming an opening in the first insulating layer to expose the first surface of the protective layer, disposing a magnetic sensing layer over the first insulating layer and the exposed portion of the protective layer, disposing a second insulating layer over at least portions of the magnetic sensing layer disposed on the substrate and removing the second insulating layer and any portions of the magnetic sensing layer from the first insulation layer.

With this particular arrangement, a method for patterning a magnetic sensing layer in a semiconductor process that utilizes an insulating material (e.g., oxide material) as both a masking layer and a layer in a final semiconductor product (e.g. a device, circuit, wafer, or other manufactured semiconductor) is provided.

In an embodiment, the second insulating layer and any portions of the magnetic sensing layer are removed from the first insulation layer using a chemical mechanical polish (CMP) technique. With this approach, an ion beam etching (IBE) step may be eliminated from the fabrication process.

In an embodiment, the method includes disposing a first insulating layer over a protective layer formed on a substrate and forming one or more openings in the first insulating material to expose predetermined portions of a surface of the protective layer.

In an embodiment, the material to be patterned as the magnetic sensing layer may be provided as one or more magnetic materials with which to form one or more magnetoresistance elements, one or more giant magnetoresistance (GMR) elements, tunneling magnetoresistance (TMR) or magnetic tunnel junction (MTJ) elements, one or more AMR elements.

In an embodiment, the magnetic sensing layer may be formed as a stack layer in combination with at least one of a synthetic antiferromagnet (SAF) layer or a double pinned layer.

In an embodiment, the first insulating layer is provided from an inorganic material. Thus, first insulating layer may comprise one or a combination of, but not limited to, silicon oxide, silicon dioxide, silicon nitride and alumina (alumina oxide) and may be provided having a thickness in the range of about 25 nm to about 700 nm.

In some embodiments, at least portions of walls which define the opening formed in the first insulating layer may have a slope profile ranging from about 45 degrees to about 90 degrees. In some embodiment, the opening may be a recess formed in the first insulating layer. For example, in one embodiment, slope profile may have a generally circular surface. A depth of the opening can be defined by a thickness of the first insulating layer.

In some embodiments, the predetermined portion of the first surface of the substrate covered by the magnetic sensing layer corresponds to a slope profile of the first wall and the second wall of the opening. A central diameter or distance between a two walls of the opening may range from about 0.5 μm to about 10 μm.

In some embodiments, the second insulating layer has a thickness ranging from about 0.5 μm to about 5 μm. In an embodiment, the second insulating layer may be formed such that its thickness is greater than about two to three times a thickness of a stack including the magnetic sensing layer, first insulating layer, the protective layer and the substrate. The second insulating layer can fill a volume defined by the opening within the first insulating layer. The second insulating layer may comprise one or a combination of, but not limited to, silicon oxide, silicon dioxide, silicon nitride and alumina (alumina oxide). In an embodiment, the second insulating layer can be disposed using at least one of chemical vapor deposition (CVD) or plasma chemical vapor deposition (PCVD). The second insulation layer may be removed using a chemical-mechanical polishing (CMP) technique. Other techniques may also be used. In an embodiment, the opening comprises the magnetic sensing layer and the second insulation layer after the removal of the second insulation layer and magnetic sensing layer from the first insulation layer.

In an embodiment, a magnetoresistance element may be formed including at least one of a giant magnetoresistance (GMR) element, an anisotropic magnetoresistance (AMR) element, a tunnel magnetoresistance (TMR) element, or a magnetic tunnel junction (MTJ) element. In an embodiment, the AMR element may be thicker than the GMR element, the TMR element or the MTJ element. Thus, a magnetoresistance element may be formed using the AMR element may be designed to accommodate the difference in thickness of the AMR element as compared with a magnetoresistance element may be formed using the GMR element, the TMR element or the MTJ element.

On another aspect, the present disclosure is directed towards a magnetoresistance element. The magnetoresistance element includes a substrate having first and second opposing surfaces. A protective layer may be formed over the first surface of the substrate. A first insulating layer can be disposed over a first surface of the protective layer on the substrate, an opening can be formed in the first insulating layer to expose the first surface of the protective layer, a magnetic sensing layer can be disposed within the opening and over a predetermined portion of the first surface of the protective layer and a second insulating layer can be disposed over the magnetic sensing layer within the opening.

In some embodiments, the first insulating layer can have a thickness of about 25 nm to about 700 nm. The first insulating layer may comprise silicon oxide, silicon dioxide, silicon nitride, alumina (alumina oxide) or a combination of them.

In some embodiments, a first edge of the opening forms a first wall of the opening and a second edge of the opening forms a second wall of the opening. The first wall and the second wall of the opening can have a slope profile ranging from about 45 degrees to about 90 degrees. A depth of the opening can be defined by a height of the first edge relative to the first surface of the substrate and a height of the second edge relative to the first surface of the substrate.

In some embodiments, the predetermined portion of the first surface of the substrate covered by the magnetic sensing layer may correspond to a slope profile of the first wall and the second wall of the opening. A central diameter (e.g., a distance between two walls) of the opening may range from about 0.5 μm to about 10 μm. The magnetic sensing layer can be formed as a stack layer, for example in combination with at least one of a synthetic antiferromagnet (SAF) layer or a double pinned layer.

In some embodiments, the second insulating layer has a thickness ranging from about 0.5 μm to about 5 μm. The second insulating layer may fill a volume defined by the opening within the first insulating layer. The second insulating layer may comprise silicon oxide, silicon dioxide, silicon nitride, alumina (alumina oxide) or a combination of them. The opening may comprise the magnetic sensing layer and the second insulation layer after the removal of the second insulation layer and magnetic sensing layer from the first insulation layer.

In an embodiment, the magnetoresistance element may include at least one of a giant magnetoresistance (GMR) element, an anisotropic magnetoresistance (AMR) element, a tunnel magnetoresistance (TMR) element, or a magnetic tunnel junction (MTJ) element.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 2 is a front view of a first insulating layer disposed over a substrate having a protective layer;

FIG. 2A is a front view of an opening formed in the first insulating layer of FIG. 2;

DETAILED DESCRIPTION

Figure 1:
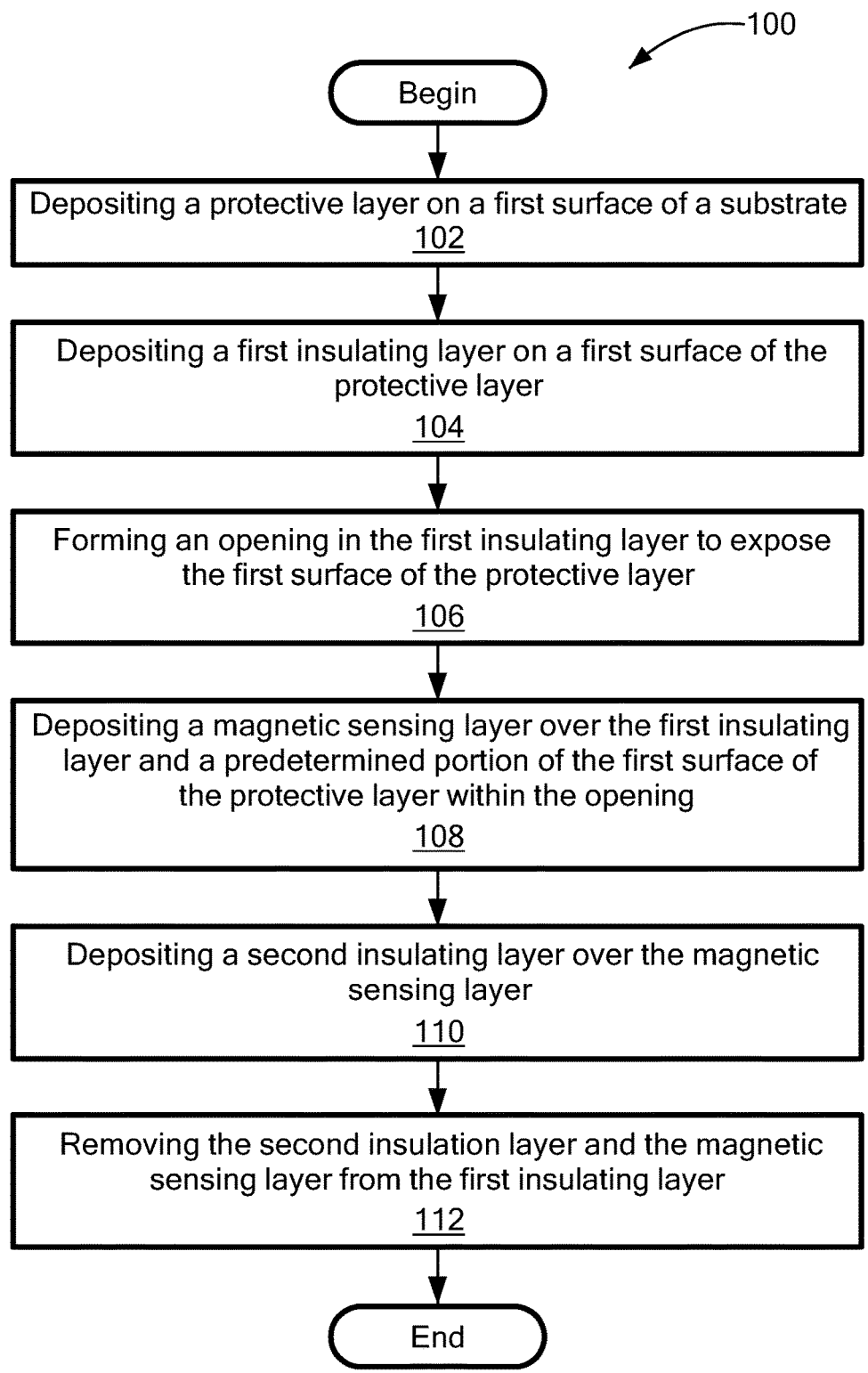
FIG. 1 is a flow diagram of a method for patterning a magnetic sensing layer in a semiconductor process.

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), and a tunneling magnetoresistance (TMR) element, also called a magnetic tunnel junction (MTJ) element.

Of these magnetoresistance elements, the GMR, MTJ, and the TMR elements operate with spin electronics (i.e., electron spins), which result in a resistance of the GMR element or the TMR element being related to an angular direction of a magnetization in a so-called "free-layer."

The magnetoresistance element may be a single element or, alternatively, may include two or more magnetoresistance elements arranged in various configurations, e.g., a half bridge or full (Wheatstone) bridge, in parallel or in series in a variety of different configurations.

As is known, metal based or metallic magnetoresistance elements (e.g., GMR, MTJ, TMR, AMR) tend to have axes of sensitivity parallel to a substrate on which they are formed.

As used herein, the term "magnetic field sensor" is used to describe a circuit that uses a magnetic field sensing element, generally in combination with other circuits. In a typical magnetic field sensor, the magnetic field sensing element and the other circuits can be integrated upon a common substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. GMR and TMR (or MTJ) elements are known to have a relatively high sensitivity, compared, for example, to silicon based Hall elements.

In one aspect, the present disclosure is directed towards techniques for patterning a magnetic sensing layer in a semiconductor process. In some embodiments, the methods discussed herein are used to fabricate a magnetoresistance element such as a yoke giant magnetoresistance (GMR)

element, a tunneling magnetoresistance (TMR) element, a magnetic tunnel junction (MTJ) element or a yoke anisotropic magnetoresistance (AMR) element.

The methods utilize one or more protective layers and/or insulating layers as masking layers during the fabrication process of a magnetoresistance element. Further, the one or more protective layers and/or insulating layers may be used in the final product produced by the methods discussed herein. Thus, in an embodiment, an ion beam etching process, typically used in a semiconductor process for a GMR device can be eliminated.

In another aspect, the present disclosure is directed toward a semiconductor structure comprising a protective layer and an insulating material (e.g., oxide material). The insulating layer may function as both a masking layer and a layer in the semiconductor structure (e.g. a device, circuit, wafer, or other manufactured semiconductor). In some embodiments, the semiconductor structure may include a magnetoresistance element such as a yoke giant magnetoresistance (GMR) element, a tunneling magnetoresistance (TMR) element, a magnetic tunnel junction (MTJ) element or a yoke anisotropic magnetoresistance (AMR) element.

Now referring to FIG. 1, a method 100 for providing a semiconductor structure includes, at block 102, disposing a protective layer on a first surface of a substrate having first and second opposing surfaces. In an embodiment, the first surface of the substrate may have the protective layer deposited on it to protect it during an etch process. The protective layer may be an insulating layer to protect the circuitry disposed on or within the substrate (e.g., a magnetic field sensing element and associated circuitry). For example, and referring to FIG. 2, a protective layer 220 may be disposed over a first surface 202a of a substrate 202. The protective layer 220 may include a different material than a first and/or second insulating layer and/or have a different etch rate than the first and/or second insulating layer. The protective layer 220 may include at least one of silicon oxide, silicon dioxide or silicon nitride. In some embodiments, the substrate 202 may include a circuit or circuitry configured to sense a magnetic field, such as a magnetic field sensor. The magnetic field sensor may use a magnetic field sensing element, generally in combination with other circuits. In some embodiments, the magnetic field sensing element and the other circuits can be integrated on the surface of or within the substrate 202 and be protected by the protective layer 220.

In the illustrative embodiment of FIGS. 2A-2D, the protective layer 220 may be disposed over the entire first surface of the substrate 202. However, it should be appreciated that the protective layer 220 may be disposed over a portion of the first surface of the substrate 202. For example, the protective layer 220 may be disposed over a portion of the first surface that corresponds to the dimensions of an opening to be formed within the first insulation layer, as described below with respect to block 106. In some embodiments, the protective layer 220 may be disposed over a portion of the first surface that corresponds to the dimensions of a magnetic sensing layer disposed within the opening of the first insulation layer, as described below with respect to block 108.

At block 104, disposing a first insulating layer on a first surface of the protective layer. In some embodiments, the first insulating is disposed using techniques such as chemical vapor deposition (CVD) or plasma chemical vapor deposition (PCVD). Other techniques may, of course, also be used.

For example and referring to FIG. 2, a first insulating layer 206 may be disposed over a first surface 220a of the protective layer 220 (e.g., silicon, alumina or any other suitable substrate material). The first insulating layer 206 may be deposited such that the desired regions or portions of first surface 220a (which may be the entire first surface 220a) are covered. In other embodiments, a less than an entire portion of the first surface 220a may be covered with the first insulating layer 206. For example, in some embodiments, less than the entire portion of the first surface 220a may not be covered by the first insulating layer 206 to allow for electrical connections to be made to the GMR region. In some embodiments, a connection may be made through the protective layer 220 to a surface (e.g., first surface 202a) or a portion of substrate 202. For example, protective layer 220 may include a via, slit or some form of an opening to allow the connection to be made from a layer disposed over protective layer 220 to a surface or portion of substrate 202. For reasons which will become apparent from the description herein below, first insulating layer 206 is provided from an inorganic material.

In an embodiment, the first insulating layer 206 may include one or any combination of silicon oxide, silicon dioxide, silicon nitride. Other materials may also be used to provide the first insulating layer. After reading the disclosure provided herein, one of ordinary skill in the art will appreciate how to select appropriate materials of combinations of materials from which to provide insulating layer 206. For example, in some embodiments, the first insulating layer 206 may include polysilicon or semiconductor material. In such an embodiment when first insulting layer 206 includes polysilicon or a semiconductor material, first insulating layer 206 may not act as an insulation layer. The first insulating layer 206 may have a thickness ranging from about 25 nm to about 250 nm. In some embodiments, the first insulating layer 206 acts as a masking layer disposed over the first surface 220a of the protective layer 220 during the fabrication process.

Referring back to FIG. 1, at block 106, one or more openings may be formed in the first insulating layer to expose the first surface of the protective layer. The openings can be formed via etching or other techniques known in the art to remove the first insulating layer from portions of the first surface of the protective layer.

Figure 3:
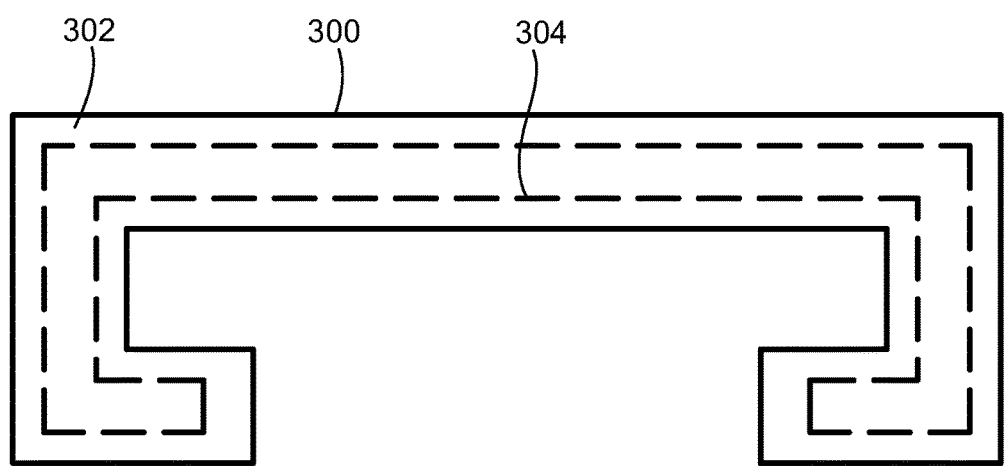
FIG. 3 is a top view of a yoke-shaped magnetoresistance element.

In an embodiment, the opening may be formed in a variety of different shapes and sizes. In some embodiments, the opening may be formed having a yoke pattern or outline (e.g. as shown in FIG. 3). For example, method 100 may be used to form a yoke shaped magnetic field sensor such as a yoke GMR. In other embodiments, the opening may be formed in a straight bar shape. It should be appreciated however that the opening may formed in a variety of different patterns including, but not limited to, squares, rectangles, quadrilaterals, circles, or a shape required for a given magnetic field sensing element pattern. The shape and size of the opening can be selected based upon a variety of factors including, but not limited to, the needs of a particular application, dimensions of a particular circuit or sensor (e.g. a magnetic field sensor) being fabricated.

Referring briefly to the illustrative embodiment of FIG. 2A, opening 214 is provided such that a first surface 220a of protective layer 220 is exposed within the opening 214. It should be noted that in this illustrative embodiment, for simplicity and to promote clarity in the drawings and written description, only one opening is shown. It is, of course, understood that in some applications two or more openings will be provided in the first insulating layer.

It should also be noted that in this illustrative embodiment, opening 214 is provided having a portion 212b corresponding to a footing region (sometimes simply referred to herein as footing 212b). Footing 212b may be provided, for example, via an over-etch technique. Thus, at least portions 212b of opening 214 may be provided having a slope profile. In some embodiments the slope of walls which define footing region 212b ranges from about 1° to about 45°. Footing 212b may be provided having a variety of different shapes (e.g. an L-shape) and sizes (e.g. footing height and depth) depending upon the needs and requirements of a particular application. In some embodiments, the combination of footing 212a and 212b may form a variety of different shapes (e.g. an L-shape) and sizes (e.g. footing height and depth) depending upon the needs and requirements of a particular application.

In an embodiment, the footing 212b may be provided to allow etching along an interface of the first insulator 206 and the first surface 220a of the protective layer 220. This may cause a setback of a first portion 212a of a wall 210 of the opening 214 as compared with a second portion 212b (i.e., footing) of the wall 210 of the opening 214 such that the second portion 212b may be larger. Thus, when a magnetic sensing layer 216 is deposited, a discontinuity in the film (or a break in the film) may be obtained. In some embodiments, the discontinuity may make it easier to define the magnetic sensing layer 216 and subsequently remove a portion of any material deposited on top of a top surface 206a of the first insulating layer 206. It should be appreciated that an angle of the footing region with respect to the first surface of the protective layer 220a may be different (i.e., $\theta_1$, $\theta_2$) for different portions of the wall of the opening 214. For example, a first footing angle, $\theta_1$, may be greater than or less than a second footing angle, $\theta_2$. In other embodiments, the first footing angle, $\theta_1$, may the same as the second footing angle, $\theta_2$.

The opening 214 is defined by first and second walls 210a, 210b with each of the first and second walls 210a, 210b beginning at a top surface 206a of the first insulating layer 206 and ending at the first surface 220a of the protective layer 220. A depth of the opening 214 can be defined by a thickness of layer 206 (or alternatively by a height of the first and second walls 210a, 210b as measured perpendicularly from the top surface 206a of the first insulating layer 206 to the first surface 220a of the protective layer 220.

As noted above, in some embodiments, portions or an entire length of the first and second walls 210a, 210b of the opening 214 may have a reentrant profile (i.e. footing 212b), sloping inward from the top surface 206a to the first surface 202a of the substrate 202. In some embodiments, the slope of the first and second walls 210a, 210b may be constant or uniform. In other embodiments, the slope of the first and second walls 210a, 210b may not have a uniform slope. For example, the first wall and second walls 210a, 210b may have two portions, with a first portion 212a (e.g., first half) having a first slope and a second portion 212b (e.g., second half) having a second slope. An angle of the first slope may be greater than an angle of the second slope. In other embodiments, the angle of the first slope may be less than the angle of the second slope. The non-uniform slope may be caused by the patterning or etching technique used to form the opening. For example, portions 212a, 212b of each of the first and second walls 210a, 210b may have a different slope. Thus, the profile of walls which define opening 214 can be optimized to obtain re-entrant, vertical, or tapered profiles. Other profiles may also be used, for example, in some embodiments, the profile of the walls may be round or circular. The particular profile to use may be selected based upon a variety of factors including, but not limited to, the needs and requirements of a particular application as well as the materials and specific processing being used in the fabrication process, In some embodiments, the opening 214 or pattern formed can have a central diameter of about 0.5 µm to about 10 µm. It should be appreciated however, that the opening may have a rectangular or yoke shape, thus the central diameter may be measured as a distance from the first wall 210a to the second wall 210b. For example, a yoke pattern may have a distance from the first wall 210a to the second wall 210b that ranges from about 0.5 µm to about 10 µm.

Referring back to FIG. 1, at block 108, a magnetic sensing layer is disposed over the first insulating layer and a predetermined portion of the first surface of the protective layer within the opening. The magnetic sensing layer may be provided from any magnetic materials suitable for forming a desired element. Such elements may include, but are not limited to, giant magnetoresistance (GMR) elements, anisotropic magnetoresistance elements (AMR), and tunnel magnetoresistance elements (TMR) also sometimes referred to as a magnetic junction (MTJ) elements.

The magnetic sensing layer may be deposited or formed on the first insulating layer as a stack layer, such as a stack layer in combination with at least one of a synthetic antiferromagnet (SAF) layer, single pinned layer or a double pinned layer.

In an embodiment, an SAF layer may be artificial antiferromagnets consisting of two or more thin ferromagnetic layers separated by a nonmagnetic layer. In an embodiment, 'pinning' or a 'pinned' layer may refer to disposing an antiferromagnetic layer over a ferromagnetic layer or vice versa. Thus, a double pinned layer may include two 'pinned' stacks of antiferromagnetic layers and ferromagnetic layers.

In an embodiment, not all of the exposed first surface of the protective layer may be covered with the magnetic sensing layer. In some embodiments, the predetermined portion is covered with the magnetic sensing layer. The predetermined portion of the first surface of the protective layer within the opening may correspond to the slope profile of the opening.

Figure 2B:
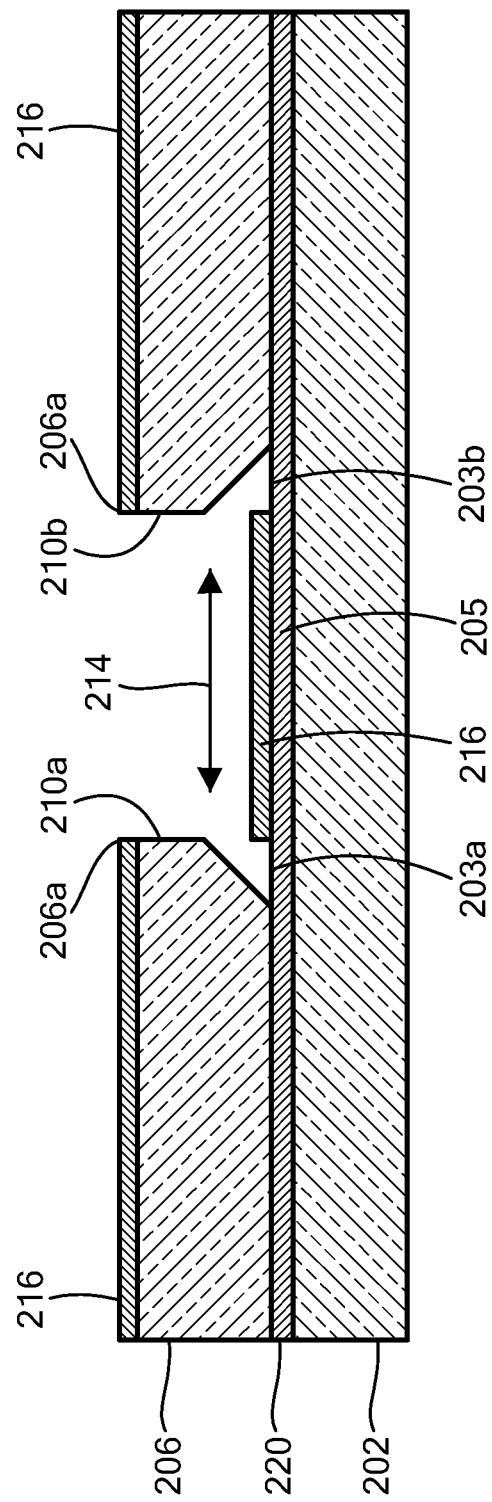
FIG. 2B is a front view of a magnetic sensing layer disposed over first insulating layer and within the opening of FIG. 2A.

For example, and referring to FIG. 2B, a magnetic sensing layer 216 is deposited or otherwise disposed over some or all of the first insulating layer 206 and a predetermined portion 205 of the first surface 220a of the protective layer 220. Each of first and second walls 210a, 210b may have a reentrant profile sloping inward from the top edge 206a of the opening 214 to the first surface 220a of the opening 214. Thus, when the magnetic sensing layer 216 is deposited within the opening 214, the top edge 206a may shield (e.g., block) portions of the first surface 220a from being covered with the magnetic sensing layer 216.

In other embodiments, a shadow mask may be disposed over insulating layer 206 prior to disposing magnetic sensing layer 216 so as to mask portions or all of the first insulating layer 206. Use of a shadow mask may thus prevent magnetic sensing layer 216 from being disposed over portions (or all) of the first insulating layer 206. In this case, the magnetic sensing layer 216 would only be disposed on unmasked portions (i.e. those portions not masked by the shadow mask) of the first insulating layer and in desired ones of openings 216 (with only one opening being illustrated in FIGS. 2-2D, as noted above).

In some embodiments, the magnetic sensing layer 216 may connect to the substrate 202 through the opening 214. For example, a via may be formed in at least one of or a combination of the opening 214, the magnetic sensing layer 216, the first insulating layer 206 and/or the protective layer 220 to couple the magnetic sensing layer 216 to the circuitry disposed within on otherwise on the substrate 202. For example, in one embodiment, a via may be formed though protective layer 220 to provide for a connection (e.g., wire bond) from magnetic sensing layer 216 to the circuitry disposed within on otherwise on the substrate 202. The magnetic sensing layer 216 may have a first and second surface and the connection to the substrate 202 may be made from either the first or second surface (e.g., top surface, bottom surface). Thus, a connection may be made to the magnetic sensing layer 216 from the substrate 202 to a bottom surface of the magnetic sensing layer 216 (e.g., wire bond, via). In other embodiments, a connection may be made to the magnetic sensing layer from the substrate 202 to a top surface of the magnetic sensing layer 216 (e.g., wire bond, via). Thus, it should be appreciated that the magnetic sensing layer 216 may be coupled to the circuitry of the substrate 202 through either a bottom surface or a top surface of the magnetic sensing layer 216. It should be appreciated that in some embodiments in which the top surface of the magnetic sensing layer 216 may be coupled to the circuitry of the substrate 202, an additional or second magnetic sensing layer (or metal layer) may be provided.

In the illustrative embodiment of FIG. 2B, within the opening 214, a first and second portions 203a, 203b of the first surface 220a are positioned under the top edges 206a of the first and second walls 210a, 210b respectively. The first and second portions 203a, 203b are not covered with the magnetic sensing layer 216. A middle portion 205, between the first and second portions 203a, 203b of the first surface 220a is not positioned under the top edge 206a of either the first and second walls 210a, 210b and is covered with the magnetic sensing layer 216. In an embodiment, the middle portion 205 may also be referred to herein as the predetermined portion of the first surface 220a of the protective layer 220. Thus, when the magnetic sensing layer 216 is deposited, the shape and properties of the opening 214 (e.g., slope profile of walls 210a, 210b of the opening, depth of the opening) may impact how the first surface 220a is covered with the magnetic sensing layer 216. For example, in some embodiments, depending on the height (i.e., thickness) of the first insulating layer 206 and a width of the opening 214, the magnetic sensing layer 216 may be narrower than the opening 214 in certain instances. It should be appreciated however, that in other embodiments, the entire first surface 202a of the substrate exposed within the opening can be covered by the magnetic sensing layer 216.

Referring back to FIG. 1, at block 110, a second insulating layer is disposed over the magnetic sensing layer. The second insulating layer may be disposed using various techniques. For example, in some embodiments, the second insulating layer is disposed using plasma enhanced chemical vapor deposition (PECVD). In other embodiments, the second insulating layer may be disposed using plasma enhanced chemical vapor deposition, also referred to as high density plasma PECVD. It should be appreciated however that PECVD is but one embodiment and that the second insulating layer may be disposed or otherwise provided using a variety of different techniques based on any known methods.

The second insulating layer may have a thickness ranging from about 0.5 µm to about 5 µm. In some embodiments, the thickness of the second insulating layer may be selected based on a thickness of the stack and/or the first insulating layer. For example, in an embodiment, the thickness of the second insulating layer may be formed such that its thickness is greater than about two to three times a thickness of a stack including the magnetic sensing layer, first insulating layer, the protective layer and the substrate. In other embodiments, the thickness of second insulating layer may be formed such that it is equal to or less than the thickness of the first insulating layer. In an embodiment, the second insulating layer may include at least one of silicon oxide, silicon dioxide, silicon nitride, alumina or a combination of two or more of them.

The second insulating may be disposed such that it covers substantially all of the previously disposed magnetic sensing layer and fills a volume defined by the opening. Thus, second insulating layer covers all of the magnetic sensing layers, exposed areas of the first surface of the protective layer and any wall portions of the opening. In some embodiments, the second insulating layer may be a masking layer.

Figure 2C:
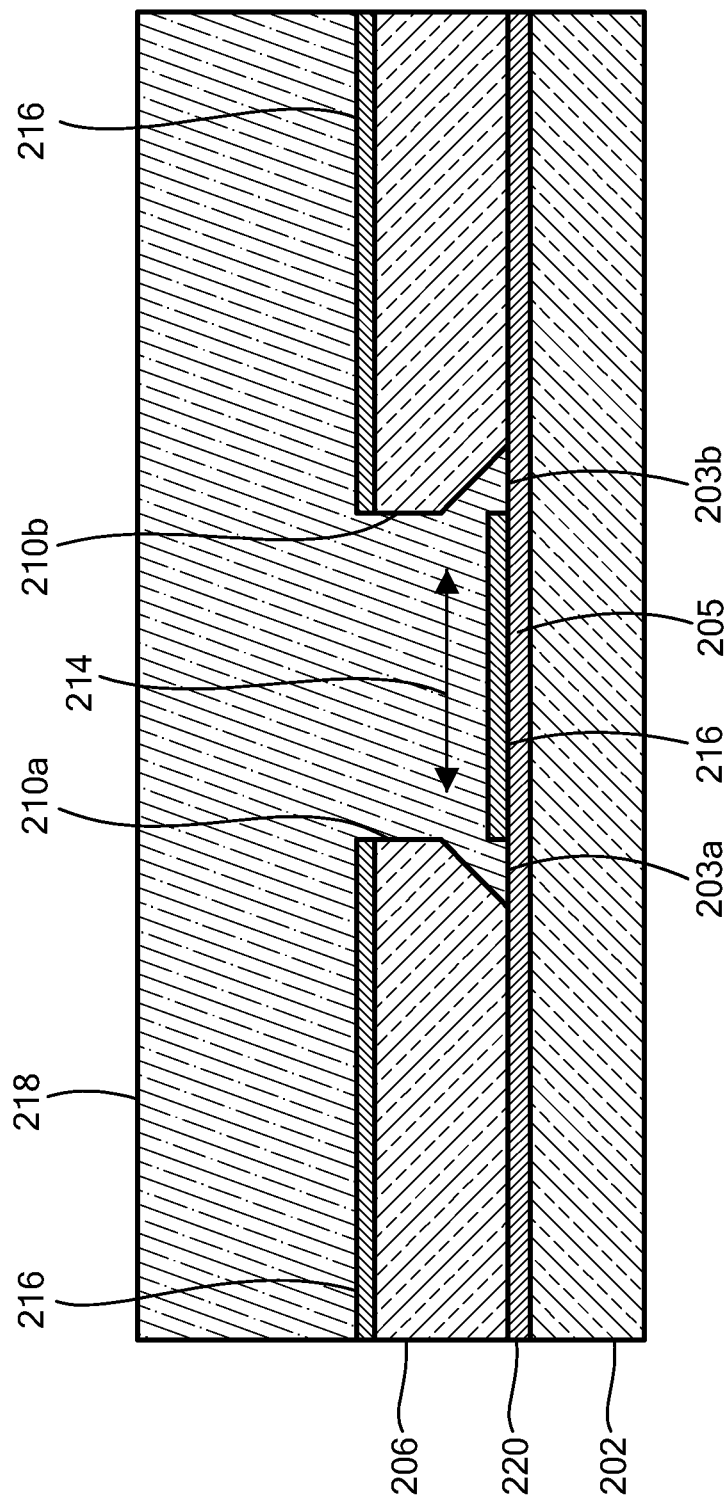
FIG. 2C is a front view of a second insulating layer disposed over the magnetic sensing layer of FIG. 2B.

For example, and referring to FIG. 2C, a second insulating layer 218 is disposed over the magnetic sensing layer 216 covering the first insulating layer 206 and within the opening 214. Thus, first and second portions 203a, 203b of the first surface 220a are covered with the second insulating layer 218, the magnetic sensing layer 216 disposed within the opening 214 is covered with the second insulating layer 218 and the first and second walls 210a, 210b of the opening 214 are covered with the second insulating layer 218.

Referring back to FIG. 1, at block 112, the second insulating layer and the magnetic sensing layer material on the surface 206a are removed from the first insulation layer. The second insulating layer and the magnetic sensing layer on the surface 206a may be removed using various techniques. For example, in some embodiments, the second insulation layer and the magnetic sensing layer on surface 206a may be removed using a chemical mechanical polishing (CMP) process.

Figure 2D:
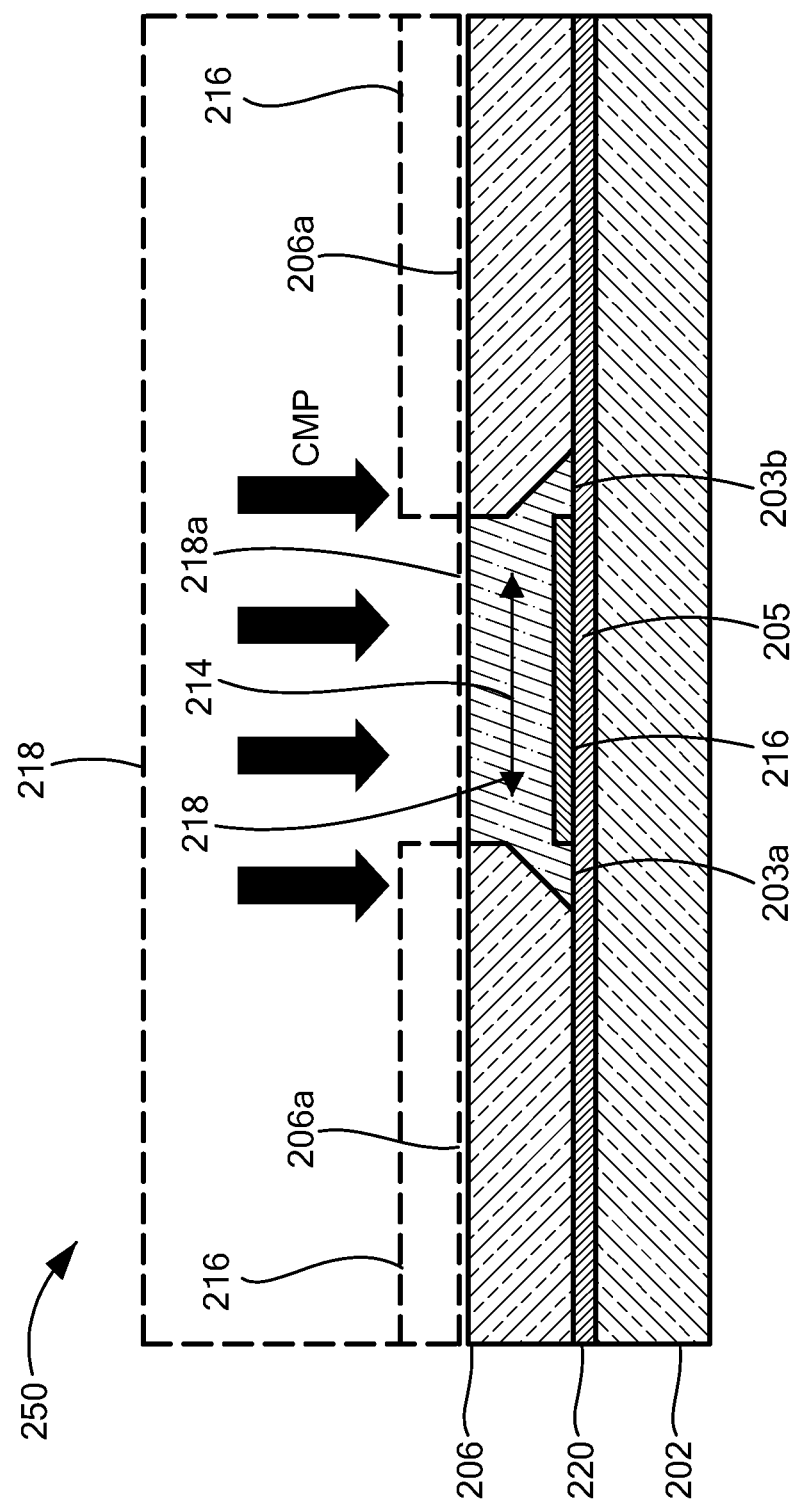
FIG. 2D is a front view of a magnetoresistance element formed after removing the second insulating layer from portions of the magnetic sensing layer.

In an embodiment, a chemical agent or paste may be applied to the second insulating layer and polished down to eliminate the magnetic sensing layers deposited on the first insulating layer as well as the second insulating layer deposited over the magnetic sensing layer. The second insulating layer may be polished off up to a plane defined by the surface of the first insulating layer, or slightly below the first insulating layer surface (as shown in FIG. 2D). Thus, the first insulating layer and the second insulating layer deposited within the opening are not removed. Since a portion of the first insulating layer remains (e.g. insulating layer 206 in FIG. 2D), it is provided from an inorganic material. In an embodiment, after the CMP process, the second insulating layer remains covering the exposed areas of the first surface of the substrate within the opening, any wall portions of the opening and the magnetic sensing layer deposited within the opening.

For example and referring to FIG. 2D, a first portion 218a of the second insulating 218 and a first portion of the magnetic sensing layer 216a (each indicated by the dotted lines) have been removed from the first surface 206a of the first insulating layer 206. Thus, the first insulating layer 206 forms part of the top surface of a magnetic field sensor 250.

A second portion 218b of the second insulating layer 218 remains within the opening 214. The second portion 218b is disposed over the first and second portions 203a, 203b of the first surface 220a, the magnetic sensing layer 216 deposited within the opening 214 and the first and second walls 210a, 210b of the opening 214.

In some embodiments, the top surface of the second portion 218b may not be flush with the top surface 206a of the first insulating layer 206 after the removal process. For example, the first insulating layer 206 may be thinner as a result of the removal process, thus the top surface 206a may not directly align with the top surface of the second portion 218*b*. In other embodiments, the top surface of the second portion 218*b* may be flush with the top surface 206*a* of the first insulating layer 206 and forms part of the top surface of the magnetic field sensor 250 with the first insulating layer 206. In some embodiments, magnetic field sensor 250 may include a magnetoresistance element.

In an embodiment, a magnetoresistance element 250 is formed using the protective layer 220, the first insulating layer 206 and the second insulating 218 as both masking layers during fabrication and layers in the final product. For example, in the illustrative embodiment of FIG. 2D, the magnetoresistance element 250 includes the magnetic sensing layer 216 disposed over the first surface 220*a* and within the opening 214 that is formed within the first insulating layer 206. The magnetic sensing layer 216 is covered by the second insulating layer 218, which fills the volume defined by the opening 214. In an embodiment, the magnetoresistance element 250 may be at least one of a giant magnetoresistance (GMR) element, an anisotropic magnetoresistance (AMR) element, a tunnel magnetoresistance (TMR) element, or a magnetic tunnel junction (MTJ) element.

Now referring to FIG. 3, a top surface of a yoke 300 includes a first insulating layer 302 and an opening 304 formed into the first insulating layer 302. The first insulating layer 302 may be deposited on a protective layer formed on a substrate (e.g., protective layer 220, substrate 202 of FIGS. 2-2D). The opening 304 may include a magnetic sensing layer and a second insulating layer disposed over the magnetic sensing layer (e.g., magnetic sensing layer 216 and second insulating layer 218 of FIG. 2D). In an embodiment, the yoke 300 may be to the same or substantially similar to the magnetoresistance element 250 described above with respect to FIG. 2D. The yoke 300 may be formed using the method described above with respect to FIGS. 1-2D.

In an embodiment, the yoke 300 may be at least one of a giant magnetoresistance (GMR) yoke-shaped sensor, an anisotropic magnetoresistance (AMR) yoke-shaped sensor, a tunnel magnetoresistance (TMR) yoke-shaped sensor, or a magnetic tunnel junction (MTJ) yoke-shaped sensor.

Having described preferred embodiments, which serve to illustrate various concepts, structures and techniques, which are the subject of this patent, it will now become apparent to those of ordinary skill in the art that other embodiments incorporating these concepts, structures and techniques may be used. It should also be appreciated, for example, that the structures described herein may also include underlying integrated circuits (IC) (not illustrated in FIGS. 2-2D) disposed on the substrate. For example, the structures may include analog and/or digital circuits disposed on the magnetic sensing layer. Accordingly, it is submitted that that scope of the patent should not be limited to the described embodiments but rather should be limited only by the spirit and scope of the following claims.

What is claimed:

1. A method for patterning a magnetic sensing layer, the method comprising:
    disposing an insulating protective layer directly on a first surface of a substrate, the substrate having first and second opposing surfaces;
    disposing a first insulating layer directly on a first surface of the insulating protective layer;
    forming an opening in the first insulating layer to expose the first surface of the protective layer;
    disposing a magnetic sensing layer over at least portions of the first insulating layer and a predetermined portion of the first surface of the insulating protective layer within the opening such that the magnetic sensing layer is in direct contact with the predetermined portion of the insulating protective layer spaced apart from wall portions of the first insulating layer within the opening;
    disposing a second insulating over the magnetic sensing layer and at least portions of the first insulating layer such that the second insulating layer is in direct contact with the magnetic sensing layer disposed over the predetermined portion of the first surface of the protective layer and portions of the first surface of the protective layer; and
    removing the second insulation layer and the magnetic sensing layer from the first insulation layer.

2. The method of claim 1 further comprising forming one or more vias through the protective layer to provide for a connection to the first surface of the substrate.

3. The method of claim 1 wherein disposing the magnetic sensing layer over a predetermined portion of the first surface of the substrate comprises depositing at least one of a giant magnetoresistance (GMR) layer, a tunnel magnetoresistance (TMR) layer, or a magnetic tunnel junction (MTJ) layer over the first surface of the substrate.

4. The method of claim 1 wherein disposing the magnetic sensing layer over a predetermined portion of the first surface of the protective layer comprises depositing a giant magnetoresistance (GMR) layer having at least one layer that includes at least one of:
    a platinum;
    a platinum alloy; or
    a manganese platinum alloy.

5. The method of claim 1 wherein disposing the magnetic sensing layer over a predetermined portion of the first surface of the protective layer comprises depositing a giant magnetoresistance (GMR) layer having at least one layer that includes a manganese platinum alloy.

6. The method of claim 1, further comprising forming a footing region within the opening.

7. The method of claim 1, further comprising removing the second insulation layer using chemical-mechanical polishing.

8. The method of claim 1, further comprising forming the magnetic sensing layer as at least one of: a stack layer in combination with at least one of a synthetic antiferromagnet (SAF) layer or a double pinned layer.

9. The method of claim 1, further comprising disposing the second insulating layer using at least one of chemical vapor deposition or plasma chemical vapor deposition.

10. The method of claim 1, further comprising filling a volume defined by the opening within the first insulating layer with the second insulating layer.

11. The method of claim 1, further comprising forming a giant magnetoresistance (GMR) element, an anisotropic magnetoresistance (AMR) element, a tunnel magnetoresistance (TMR) element, or a magnetic tunnel junction (MTJ) element.

12. The method of claim 1, wherein the first insulating layer comprises silicon oxide, silicon dioxide, silicon nitride, alumina or a combination of them.

13. The method of claim 1, wherein the second insulating layer comprises silicon oxide, silicon dioxide, silicon nitride, alumina or a combination of them.

14. The method of claim 1, wherein the protective layer comprises silicon oxide, silicon dioxide, silicon nitride, alumina, aluminum oxide or a combination of them.

15. The method of claim 1, wherein the protective layer has a different etch rate from the first insulating layer.

16. The method of claim 1, wherein the protective layer includes one type of material.

17. A magnetoresistance element comprising:
a substrate having first and second opposing surfaces;
an insulating protective layer disposed over and in direct contact with the first surface of the substrate;
a first insulating layer disposed over and in direct contact with a first surface of the insulating protective layer;
an opening formed in the first insulating layer to expose the first surface of the insulating protective layer;
a magnetic sensing layer disposed within the opening and in direct contact with a predetermined portion of the first surface of the insulating protective layer;
a second insulating layer disposed over the magnetic sensing layer within the opening, wherein the second insulating layer is disposed such that the second insulating layer is in direct contact with the magnetic sensing layer disposed over the predetermined portion of the first surface of the protective layer and portions of the first surface of the protective layer.

18. The magnetoresistance element of claim 17, wherein the first insulating layer has a thickness in a range of about 25 nm to about 700 nm.

19. The magnetoresistance element of claim 17, wherein the first insulating layer comprises silicon oxide, silicon dioxide, silicon nitride, alumina or a combination of them.

20. The magnetoresistance element of claim 17, wherein a first edge of the opening forms a first wall of the opening and a second edge of the opening forms a second wall of the opening.

21. The magnetoresistance element of claim 20, wherein the first wall and the second wall of the opening have a slope profile ranging from about 45 degrees to about 90 degrees.

22. The magnetoresistance element of claim 20, wherein a depth of the opening is defined by a height of the first edge relative to the first surface of the protective layer and a height of the second edge relative to the first surface of the substrate.

23. The magnetoresistance element of claim 20, wherein the predetermined portion of the first surface of the protective layer covered by the magnetic sensing layer corresponds to a slope profile of the first wall and the second wall of the opening.

24. The magnetoresistance element of claim 17, wherein a central width or a central diameter of the opening ranges from about 0.5 µm to about 10 µm.

25. The magnetoresistance element of claim 17, wherein the magnetic sensing layer is formed as a stack layer in combination with at least one of a synthetic antiferromagnet (SAF) layer or a double pinned layer.

26. The magnetoresistance element of claim 17, wherein the second insulating layer has a thickness ranging from about 0.5 µm to about 5 µm.

27. The magnetoresistance element of claim 17, wherein the second insulating layer fills a volume defined by the opening within the first insulating layer.

28. The magnetoresistance element of claim 17, wherein the second insulating layer comprises silicon oxide, silicon dioxide, silicon nitride, alumina or a combination of them.

29. The magnetoresistance element of claim 17, wherein the opening comprises the magnetic sensing layer and the second insulation layer after the removal of the second insulation layer and magnetic sensing layer from the first insulation layer.

30. The magnetoresistance element of claim 17, further comprising a giant magnetoresistance (GMR) element, an anisotropic magnetoresistance (AMR) element, a tunnel magnetoresistance (TMR) element, or a magnetic tunnel junction (MTJ) element.

31. The magnetoresistance element of claim 17, wherein the protective layer comprises silicon oxide, silicon dioxide, silicon nitride, alumina, aluminum oxide or a combination of them.

32. The magnetoresistance element of claim 17, wherein the protective layer has a different etch rate from the first insulating layer.

* * * * *